United States Patent
Bao et al.

(10) Patent No.: US 6,734,101 B1
(45) Date of Patent: May 11, 2004

(54) SOLUTION TO THE PROBLEM OF COPPER HILLOCKS

(75) Inventors: Tien-I Bao, Hsin-chu (TW); Jeng Shwang-Ming, Hsin-chu (TW); Syun-Ming Jang, Hsin-Chu (TW); Chen-Hua Yu, Hsin-chu (TW); Kuen-Chyr Lee, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 68 days.

(21) Appl. No.: 09/998,787

(22) Filed: Oct. 31, 2001

(51) Int. Cl.$^7$ .......................... H01L 21/4763
(52) U.S. Cl. .............. 438/687; 438/622; 438/627
(58) Field of Search .................. 738/618, 622, 738/627, 687

(56) References Cited

U.S. PATENT DOCUMENTS

| | | | |
|---|---|---|---|
| 5,589,233 A | 12/1996 | Law et al. | 427/579 |
| 5,612,254 A | 3/1997 | Mu et al. | 437/195 |
| 5,654,232 A | 8/1997 | Gardner | 438/661 |
| 5,714,418 A | 2/1998 | Bai et al. | 438/627 |
| 6,080,655 A * | 6/2000 | Givens et al. | 438/626 |
| 6,472,755 B1 * | 10/2002 | Ngo et al. | 257/762 |
| 2002/0076925 A1 * | 6/2002 | Marlieb et al. | 438/678 |

* cited by examiner

*Primary Examiner*—Michael Trinh
*Assistant Examiner*—Pamela E Perkins
(74) *Attorney, Agent, or Firm*—George O. Saile; Stephen B. Ackerman; Rosemary L. S. Pike

(57) ABSTRACT

A new method of reducing copper hillocks in copper metallization is described. An opening is made through a dielectric layer overlying a substrate on a wafer. A copper layer is formed overlying the dielectric layer and completely filling the opening. The copper layer is polished back to leave the copper layer only within the opening. Copper hillocks are reduced by: coating an oxide layer over the copper layer and the dielectric layer, thereafter heating the wafer using $NH_3$ plasma, and thereafter depositing a capping layer overlying the oxide layer wherein the time lapse between polishing back the copper layer and depositing the capping layer is less than one day (24 hours).

29 Claims, 3 Drawing Sheets

SOLUTION TO THE PROBLEM OF COPPER HILLOCKS

BACKGROUND OF THE INVENTION (1) Field of the Invention

The invention relates to a method of copper metallization in the fabrication of integrated circuits, and more particularly, to a method of reducing the formation of copper hillocks in copper metallization in the manufacture of integrated circuits.

(2) Description of the Prior Art

In a common application for integrated circuit fabrication, a contact/via opening is etched through an insulating layer to an underlying conductive area to which electrical contact is to be made. A conducting layer material is deposited within the contact/via opening. Because of its lower bulk resistivity, Copper (Cu) metallization is the future technology for feature sizes of 0.18 microns and below. Often, a damascene or dual damascene process is used to provide Cu metallization. The copper is deposited within the damascene opening and polished back. Then, a capping layer, such as silicon nitride or silicon carbide, is deposited over the copper plugs to prevent copper from diffusing into overlying layers.

Typically, before the capping layer is deposited, the wafer is heated to stabilize the wafer temperature. A coating of the capping layer material on the deposition chamber walls releases $NH_x$-related molecules that react with copper to cause Cu hillock generation. Cu hillocks are also caused by exposing the wafers to $NH_3$ gas in the ambient of the deposition chamber. Copper hillocks reduce copper reliability and confuse defect inspection tools. Reduction of copper hillocks in the copper damascene process becomes more and more important for yield and reliability improvement. It is desired to reduce copper hillock generation in the copper metallization process.

U.S. Pat. No. 5,714,418 to Bai et al discloses a capping layer of nitride over copper, then an oxide layer. U.S. Pat. No. 5,612,254 to Mu et al a silicon nitride layer over copper. U.S. Pat. No. 5,654,232 to Gardner teaches a copper damascene process. U.S. Pat. No. 5,589,233 to Law et al shows a chamber pre-coat process. None of the references discusses Cu hillock prevention.

SUMMARY OF THE INVENTION

A principal object of the present invention is to provide an effective and very manufacturable method of reducing copper hillocks in a copper metallization process in the fabrication of integrated circuit devices.

Another object of the invention is to provide a method for reducing copper hillocks by reducing copper oxide formation.

A further object of the invention is to provide a method for reducing copper hillocks by pre-coating the deposition chamber with an oxide layer.

A still further object of the invention is to provide a method for reducing copper hillocks by using $NH_3$ plasma rather than $NH_3$ gas for CuO reduction after copper chemical mechanical polishing (CMP).

Yet another object of the invention is to provide a method for reducing copper hillocks by reducing the time between copper CMP and capping layer deposition to less than one day.

Yet another object of the invention is to provide a method for reducing copper hillocks by reducing the time between copper CMP and capping layer deposition to less than one day, pre-coating the deposition chamber with an oxide layer, and using $NH_3$ plasma rather than $NH_3$ gas for CuO removal.

In accordance with the objects of this invention a new method of reducing copper hillocks in copper metallization is achieved. An opening is made through a dielectric layer overlying a substrate on a wafer. A copper layer is formed overlying the dielectric layer and completely filling the opening. The copper layer is polished back to leave the copper layer only within the opening. Copper hillocks are reduced by: coating the deposition chamber with an oxide layer, thereafter heating the wafer using $NH_3$ plasma, and thereafter depositing a capping layer overlying the copper layer and the dielectric layer wherein the time lapse between polishing back the copper layer and depositing the capping layer is less than one day (24 hours).

BRIEF DESCRIPTION OF THE DRAWINGS

In the accompanying drawings forming a material part of this description, there is shown.

DESCRIPTION OF THE PREFERRED EMBODIMENTS

The present invention provides a method for reducing copper hillocks. Hillocks reduce copper reliability and confuse defect inspection tools. Recent studies have shown that copper hillock generation after silicon nitride deposition is caused by the sensitivity of the copper surface to the deposition environment and a low copper oxide (CuO) reduction rate. After the wafer is heated to 400° C. in the deposition chamber, copper grain growth is effected by the chamber pre-coat material and by the presence of CuO.

Figure 1:
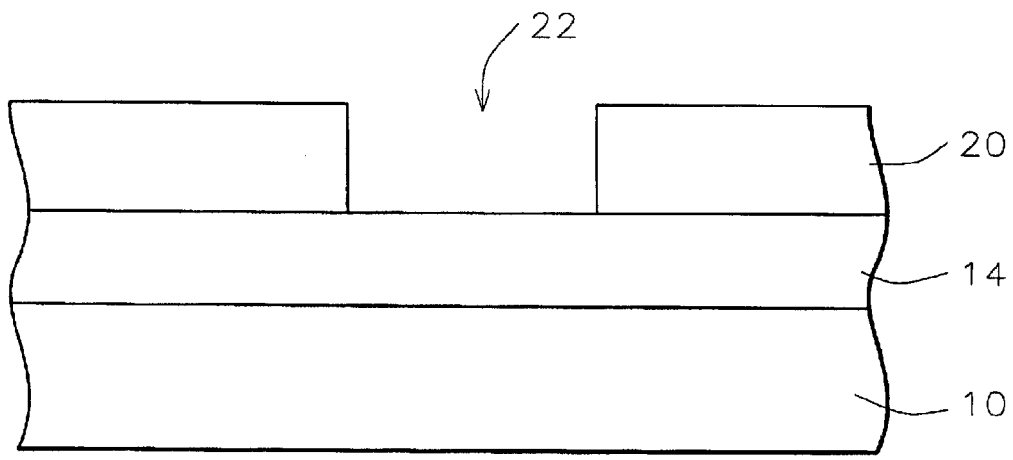
FIGS. 1 through 5 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures may be formed in and on the semiconductor substrate. For example, gate electrodes and source/drain regions as well as lower levels of metallization may be formed. The semiconductor device structures, not shown, are contained in layer 14.

An insulating layer 20, composed of silicon dioxide, borophosphosilicate glass (BPSG), borosilicate glass (BSG), phosphosilicate glass (PSG), or the like, is deposited over the semiconductor structures to a thickness of between about 100 and 10,000 Angstroms and preferably planarized.

A contact/via opening 22 is etched through the insulating layer 20 to one of the semiconductor device structures within the layer 14, not shown. The opening 22 may be a single or dual damascene opening, for example.

Figure 2:
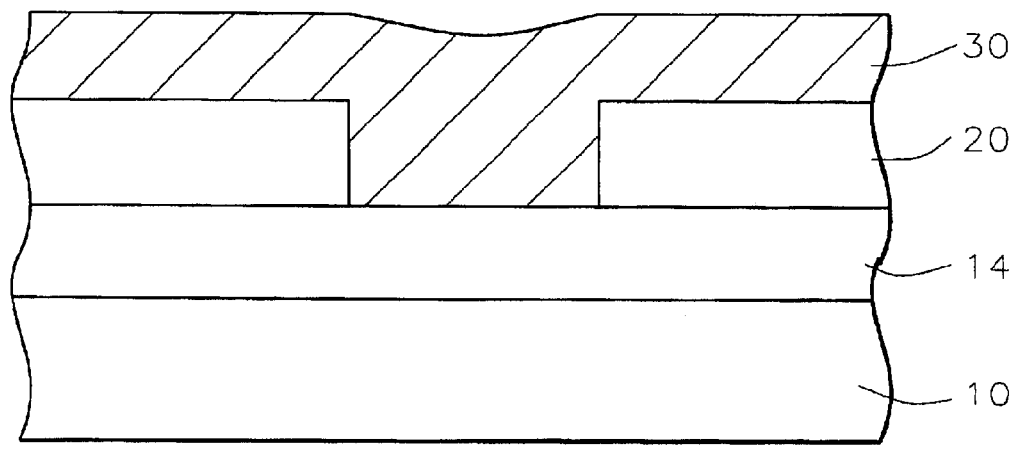

Now, a barrier layer may be deposited, not shown. A copper layer 30 is deposited to fill the opening 22, as shown in FIG. 2. The copper layer may be deposited by physical or chemical vapor deposition, electroplating, or electroless plating, for example.

Figure 3:
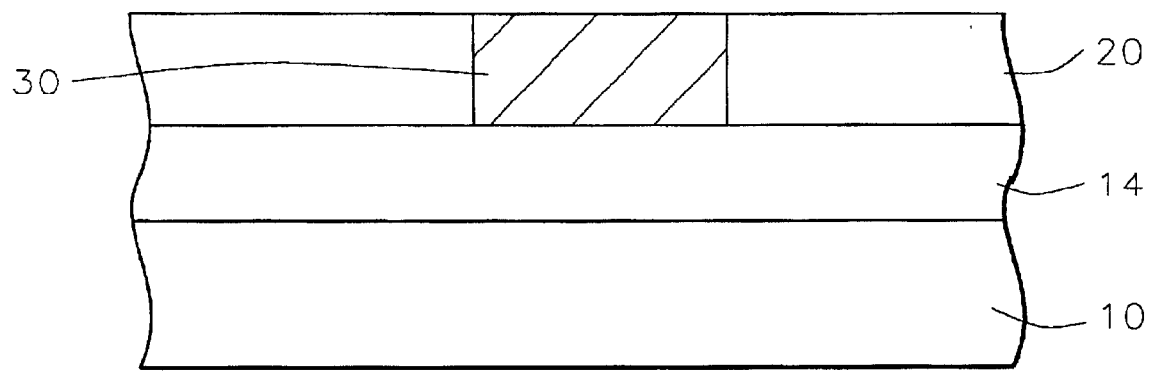

Referring now to FIG. 3, the copper layer is polished such as by chemical mechanical polishing (CMP) to leave the copper layer only within the opening.

Now, a capping layer is to be deposited over the copper line to prevent copper diffusion. Typically, a silicon nitride or silicon carbide layer, for example, is deposited over the copper line. First, the wafer is heated in a plasma-enhanced chemical vapor deposition (PECVD) chamber to stabilize the wafer temperature. Both the pre-coat and the presence of CuO in the chamber have been found to increase the generation of copper hillocks, as discussed above.

A key to reducing hillocks is to reduce CuO prior to heating the wafer. Typically, $NH_3$ gas is present in the deposition chamber to generate the H gas that will reduce CuO to Cu. $NH_3$ plasma has a higher CuO reduction rate than does $NH_3$ gas. This is because $NH_3$ plasma has a higher H atom generation rate. Therefore, the process of the present invention uses $NH_3$ plasma in the deposition chamber to heat the wafer to between about 200 and 600° C. and to more efficiently reduce CuO to Cu. For example, $N_2$ is flowed at about 1000 sccm while $NH_3$ is flowed at about 4000 sccm. 13.5 6 MHz radio frequency power is at about 500 watts and a pressure of about 2 Torr is maintained to generate the $NH_3$ plasma of the present invention.

Figure 4:
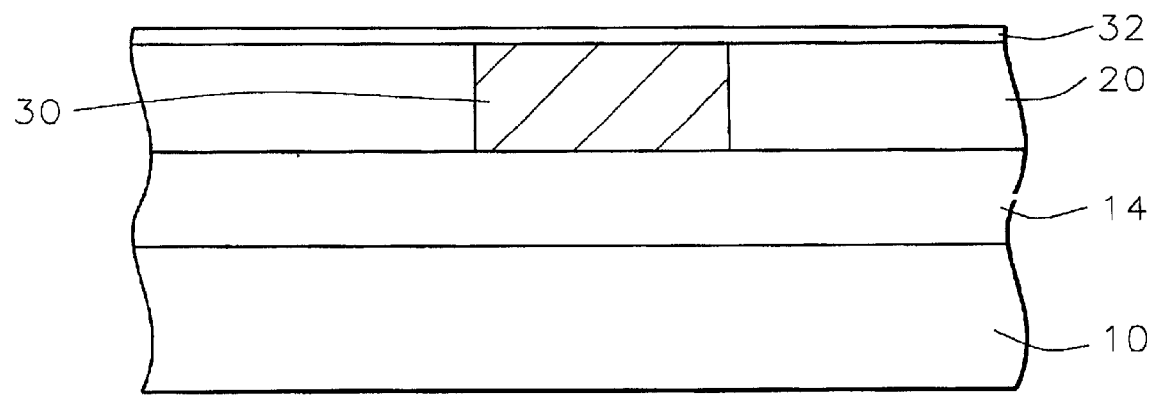

Also within the chamber prior to heating the wafer, an oxide layer 32 is pre-coated on the chamber walls and on the wafer as illustrated in FIG. 4. The oxide layer is coated to a thickness of between about 10 and 10,000 Angstroms. The oxide pre-coat of the chamber walls reduces copper hillock generation because the oxide will not react with the $NH_3$ residues in the chamber to form copper hillocks. Without the oxide coating the chamber walls, the capping layer would coat the chamber walls. The capping layer will react with the $NH_3$ residues to form copper hillocks.

Figure 5:
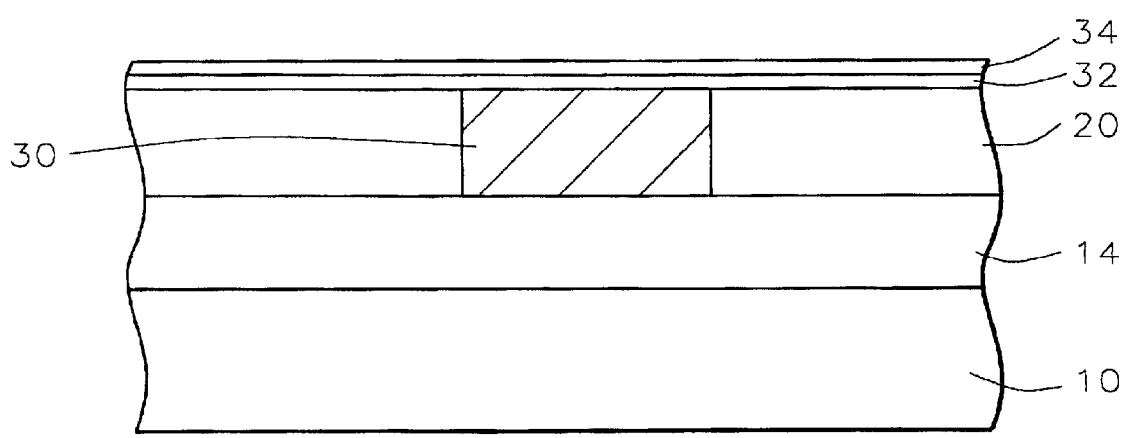

Now, as shown in FIG. 5, a capping layer 34 is deposited over the pre-coating 32. The capping layer comprises silicon nitride or silicon carbide, for example, having a thickness of between about 100 and 2000 Angstroms. This completes the copper metallization. Hillocks are reduced in the process of the invention. Processing now continues as is conventional in the art. For example, higher levels of metallization may be fabricated. The post-copper CMP processing of the present invention may be used in subsequent copper levels to further reduce copper hillocks.

Additionally, it is important that the time between copper CMP and the capping layer deposition should be less than one day (24 hours) in order to reduce CuO formation.

The process of the present invention reduces copper hillock formation by reducing the sensitivity of the copper surface to the deposition environment and by reducing the CuO presence. This is achieved by: 1) pre-coating an oxide layer on the deposition chamber walls, 2) using $NH_3$ plasma rather than $NH_3$ gas in the deposition chamber, and 3) keeping the time between copper CMP and capping layer deposition to less than one day (24 hours).

While the invention has been particularly shown and described with reference to the preferred embodiments thereof, it will be understood by those skilled in the art that various changes in form and details may be made without departing from the spirit and scope of the invention.

It is claimed:

1. A method of copper metallization in the fabrication of an integrated circuit device comprising:

providing an opening through a dielectric layer overlying a substrate on a wafer;

forming a copper layer overlying said dielectric layer and completely filling said opening;

polishing back said copper layer to leave said copper layer only within said opening;

coating an oxide layer on said dielectric layer and said copper layer and on the walls of a deposition chamber;

thereafter heating said wafer in said deposition chamber using a plasma; and thereafter depositing in said deposition chamber a capping layer overlying said oxide layer to complete said copper metallization in said fabrication of said integrated circuit device.

2. The method according to claim 1 further comprising forming semiconductor device structures in and on said substrate wherein said semiconductor device structures include gate electrodes, source/drain regions, and lower level metallization.

3. The method according to claim 1 wherein said opening is made to a semiconductor device structure within said substrate.

4. The method according to claim 1 wherein said step of forming said copper layer is selected from the group consisting of: physical vapor deposition, chemical vapor deposition, electroplating, and electroless plating.

5. The method according to claim 1 wherein said step of polishing back said copper layer comprises chemical mechanical polishing.

6. The method according to claim 1 wherein said steps of coating said oxide layer, heating said wafer, and depositing said capping layer are performed in a single plasma-enhanced chemical vapor deposition chamber.

7. The method according to claim 1 wherein said oxide layer is coated to a thickness of between about 10 and 10,000 Angstroms.

8. The method according to claim 1 wherein said plasma comprises $NH_3$ plasma.

9. The method according to claim 1 wherein said step of heating said wafer comprises heating said wafer to between about 200 and 600° C.

10. The method according to claim 1 wherein said capping layer is selected from the group consisting of silicon nitride and silicon carbide and wherein said capping layer has a thickness of between about 100 and 2000 Angstroms.

11. The method according to claim 1 wherein said the time elapsed between said step of polishing back said copper layer and said step of depositing said capping layer is less than one day (24 hours).

12. A method of copper metallization in the fabrication of an integrated circuit device comprising:

providing an opening through a dielectric layer overlying a substrate on a wafer;

forming a copper layer overlying said dielectric layer and completely filling said opening;

polishing back said copper layer to leave said copper layer only within said opening;

coating an oxide layer on said dielectric layer and said copper layer and on the walls of a deposition chamber;

thereafter heating said water in said deposition chamber using $NH_3$ plasma; and thereafter depositing in said deposition chamber a capping layer overlying said oxide layer to complete said copper metallization in said fabrication of said integrated circuit device.

13. The method according to claim 12 further comprising forming semiconductor device structures in and on said substrate wherein said semiconductor device structures include gate electrodes, source/drain regions, and lower level metallization.

14. The method according to claim 12 wherein said opening is made to a semiconductor device structure within said substrate.

15. The method according to claim 12 wherein said step of forming said copper layer is selected from the group consisting of: physical vapor deposition, chemical vapor deposition, electroplating, and electroless plating.

16. The method according to claim 12 wherein said step of polishing back said copper layer comprises chemical mechanical polishing.

17. The method according to claim 12 wherein said steps of coating said oxide layer, heating said wafer, and depositing said capping layer are performed in a single plasma-enhanced chemical vapor deposition chamber.

18. The method according to claim 12 wherein said oxide layer is coated to a thickness of between about 10 and 10,000 Angstroms.

19. The method according to claim 12 wherein said step of heating said wafer comprises heating said wafer to between about 200 and 600° C.

20. The method according to claim 12 wherein said capping layer is selected from the group consisting of silicon nitride and silicon carbide and wherein said capping layer has a thickness of between about 100 and 2000 Angstroms.

21. The method according to claim 12 wherein said the time elapsed between said step of polishing back said copper layer and said step of depositing said capping layer is less than one day (24 hours).

22. A method of copper metallization in the fabrication of an integrated circuit device comprising:

provisioning an opening through a dielectric layer overlying a substrate on a wafer;

forming a copper layer overlying said dielectric layer and completely filling said opening;

polishing back said copper layer to leave said copper layer only within said opening; and within 24 hours after said polishing back said copper layer, completing the following steps:

coating an oxide layer on said dielectric layer and said copper layer and on the walls of a deposition chamber;

thereafter heating in said deposition chamber said wafer using $NH_3$ plasma; and thereafter depositing in said deposition chamber a capping layer overlying said oxide layer wherein said oxide layer on said walls of said deposition chamber prevents said capping layer from coating said deposition chamber walls thereby preventing formation of copper hillocks to complete said copper metallization in said fabrication of said integrated circuit device.

23. The method according to claim 22 further comprising forming semiconductor device structures in and on said substrate wherein said semiconductor device structures include gate electrodes, source/drain regions, and lower level metallization.

24. The method according to claim 22 wherein said opening is made to a semiconductor device structure within said substrate.

25. The method according to claim 22 wherein said step of forming said copper layer is selected from the group consisting of: physical vapor deposition, chemical vapor deposition, electroplating, and electroless plating.

26. The method according to claim 22 wherein said step of polishing back said copper layer comprises chemical mechanical polishing.

27. The method according to claim 22 wherein said steps of coating said oxide layer, heating said wafer, and depositing said capping layer are performed in a single plasma-enhanced chemical vapor deposition chamber.

28. The method according to claim 22 wherein said oxide layer is coated to a thickness of between about 10 and 10,000 Angstroms.

29. The method according to claim 22 wherein said step of heating said wafer comprises heating said wafer to between about 200 and 600° C.

* * * * *

UNITED STATES PATENT AND TRADEMARK OFFICE
CERTIFICATE OF CORRECTION

PATENT NO.   : 6,734,101 B1
DATED        : May 11, 2004
INVENTOR(S)  : Tien I. Bao et al.

It is certified that error appears in the above-identified patent and that said Letters Patent is hereby corrected as shown below:

Title page,
Item [75], Inventors, delete "Jeng Shwang-Ming, Hsin-chu (TW)", and replace with -- Shwang-Ming Jeng, Hsin-Chu (TW) --.

Signed and Sealed this

Thirtieth Day of November, 2004

JON W. DUDAS
*Director of the United States Patent and Trademark Office*